(12) United States Patent
Fang et al.

(10) Patent No.: US 11,963,453 B1
(45) Date of Patent: Apr. 16, 2024

(54) PIEZOELECTRIC SENSOR

(71) Applicants: East China University of Science and Technology, Shanghai (CN); Ningbo University, Zhejiang (CN)

(72) Inventors: Haiping Fang, Shanghai (CN); Liang Chen, Zhejiang (CN); Chaofeng Lv, Zhejiang (CN)

(73) Assignees: EAST CHINA UNIVERSITY OF SCIENCE AND TECHNOLOGY, Shanghai (CN); NINGBO UNIVERSITY, Ningbo (CN)

( * ) Notice: Subject to any disclaimer, the term of this patent is extended or adjusted under 35 U.S.C. 154(b) by 0 days.

(21) Appl. No.: 18/454,097

(22) Filed: Aug. 23, 2023

(30) Foreign Application Priority Data

Aug. 2, 2023 (CN) .......................... 202310967206.0

(51) Int. Cl.
| | | |
|---|---|---|
| *H01L 41/113* | (2006.01) | |
| *G01L 1/16* | (2006.01) | |
| *H10N 30/30* | (2023.01) | |
| *H10N 30/853* | (2023.01) | |
| *H10N 30/88* | (2023.01) | |

(52) U.S. Cl.
CPC .......... *H10N 30/8542* (2023.02); *G01L 1/16* (2013.01); *H10N 30/302* (2023.02); *H10N 30/308* (2023.02); *H10N 30/88* (2023.02)

(58) Field of Classification Search
CPC ..... H10N 30/308; H10N 30/302; H10N 30/88
See application file for complete search history.

(56) References Cited

U.S. PATENT DOCUMENTS

2023/0160762 A1* 5/2023 Tsai .......................... G01L 1/16
73/862.625

OTHER PUBLICATIONS

Shi, G., Chen, L., Yang, Y., Li, D., Qian, Z., Liang, S., Yan,L., Li, L.-H., Wu, M., Fang, H. Two-dimensional Na—Cl crystals of unconventional stoichiometries on graphene surface from dilute solution at ambient conditions. Nature Chemistry 10, 776-779 (2018). https://doi.org/10.1038/s41557-018-0061-4.

Xia, X., Huang, Y., Peng, B., Wang, T., Yi, R., Zhao, Y., Jiang, J., Dai, F., Fan, Y., Li, P., Tu, Y., Zhang, L., Chen, L., Fang, H. High-yield Synthesis of Sodium Chlorides of Unconventional Stoichiometries. Advanced Materials 2303072 (2023) https://doi.org/10.1002/adma.202303072.

* cited by examiner

*Primary Examiner* — Derek J Rosenau

(57) ABSTRACT

A piezoelectric sensor is provided. The piezoelectric sensor comprises a first base, a first conductive layer adjacent to the first base, a second base, a second conductive layer adjacent to the second base; and a first structure between the first conductive layer and the second conductive layer. The first structure comprises a first layer with a first carbon-based material and a plurality of second structures with piezoelectricity. Each of the plurality of second structures comprises a second layer with a second carbon-based material and a third layer adjacent to the second layer. The third layer comprises a material of two-dimensional crystals of unconventional stoichiometries such as $Na_2Cl$ crystals.

10 Claims, 5 Drawing Sheets

PIEZOELECTRIC SENSOR

TECHNOLOGICAL FIELD

The present disclosure relates generally to a piezoelectric sensor, and in particular, to a piezoelectric sensor using carbon-based material such as graphene oxide and also using two-dimensional crystals of unconventional stoichiometries such as $Na_2Cl$ crystals.

BACKGROUND

A piezoelectric sensor is a device that utilizes the piezoelectric effect to measure changes in mechanical (or pressure) signals by converting them to an electrical signal.

Some conventionally and widely used piezoelectric materials include lead zirconate titanate (PZT), barium titanate (BTO), zinc oxide (ZnO) and polyvinylidene fluoride (PVDF). Piezoelectric sensors or piezoelectricity-based pressure sensors made by using these piezoelectric materials usually can provide good sensitivity and/or fast response speed in practical applications. However, the performance of the piezoelectric sensors still needs further improvement to satisfy the requirements for next-generation pressure sensors.

Therefore, it would be desirable to have a piezoelectric sensor that takes into account at least some of the issues discussed above, as well as other possible issues.

BRIEF SUMMARY

Example embodiments of the present disclosure are directed to a piezoelectric sensor using carbon-based material and two-dimensional $Na_2Cl$ crystals. Comparing to conventional and existing pressure sensors, example embodiments can provide a piezoelectric sensor or piezoelectricity-based pressure sensor with higher sensitivity, lower pressure detection limit, and/or faster response speed. Also, example embodiments can provide a piezoelectric sensor or piezoelectricity-based pressure sensor with flexibility, self-powered capability, and repeatability via mechano-electric transduction.

The present disclosure thus includes, without limitation, the following example embodiments.

Some example embodiments provide a piezoelectric sensor. The piezoelectric sensor comprises a first base, a first conductive layer adjacent to the first base, a second base, a second conductive layer adjacent to the second base; and a first structure between the first conductive layer and the second conductive layer. The first structure comprises a first layer with a first carbon-based material and a plurality of second structures with piezoelectricity. Each of the plurality of second structures comprises a second layer with a second carbon-based material and a third layer adjacent to the second layer. The third layer comprises a material of two-dimensional crystals of unconventional stoichiometries.

In some embodiments, the first base and the second base comprise a first insulation film and a second insulation film respectively.

In some embodiments, the first insulation film comprises a first Polyimide (PI), Ethylene Vinyl Acetate Copolymer (EVA), Polyvinyl chloride (PVC), Polydimethylsiloxane (PDMS), Polyvinyl Alcohol (PVA), Polypropylene (PP), or Polyethylene glycol terephthalate (PET) film, and the second insulation film comprises a second polyimide (PI), Ethylene Vinyl Acetate Copolymer (EVA), Polyvinyl chloride (PVC), Polydimethylsiloxane (PDMS), Polyvinyl Alcohol (PVA), Polypropylene (PP), or Polyethylene glycol terephthalate (PET) film.

In some embodiments, the first conductive layer and the second conductive layer comprise a first electrode and a second electrode respectively.

In some embodiments, the first electrode comprises a first gold (Au), silver (Ag), platinum (Pt), titanium (Ti), chromium (Cr), copper (Cu), nickel (Ni), aluminum (Al), graphene, or MXene electrode, and the second electrode comprises a second gold (Au), silver (Ag), platinum (Pt), titanium (Ti), chromium (Cr), copper (Cu), nickel (Ni), aluminum (Al), graphene, or MXene electrode.

In some embodiments, a first wire is connected to the first electrode and a second wire is connected to the second electrode.

In some embodiments, the first conductive layer is in contact with the first layer, and the second conductive layer is in contact with the second layer of one of the plurality of second structures.

In some embodiments, the first structure comprises a membrane.

In some embodiments, the first carbon-based material comprises graphene oxide, reduced graphene oxide, carbon nanotube or fullerene, and the second carbon-based material comprises graphene oxide, reduced graphene oxide, carbon nanotube or fullerene.

In some embodiments, the piezoelectric sensor further comprises a tape as an encapsulation of the piezoelectric sensor.

In some embodiments, the third layer comprises a material of $Na_2Cl$ crystals.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example embodiment described herein. This disclosure is intended to be read holistically such that any separable features or elements of the disclosure, in any of its aspects and example embodiments, should be viewed as combinable unless the context of the disclosure clearly dictates otherwise.

It will therefore be appreciated that this Brief Summary is provided merely for purposes of summarizing some example embodiments so as to provide a basic understanding of some aspects of the disclosure. Accordingly, it will be appreciated that the above described example embodiments are merely examples and should not be construed to narrow the scope or spirit of the disclosure in any way. Other example embodiments, aspects and advantages will become apparent from the following detailed description taken in conjunction with the accompanying figures which illustrate, by way of example, the principles of some described example embodiments.

BRIEF DESCRIPTION OF THE FIGURE(S)

Having thus described example embodiments of the disclosure in general terms, reference will now be made to the accompanying figures, which are not necessarily drawn to scale, and wherein:

DETAILED DESCRIPTION

Figure 1A:
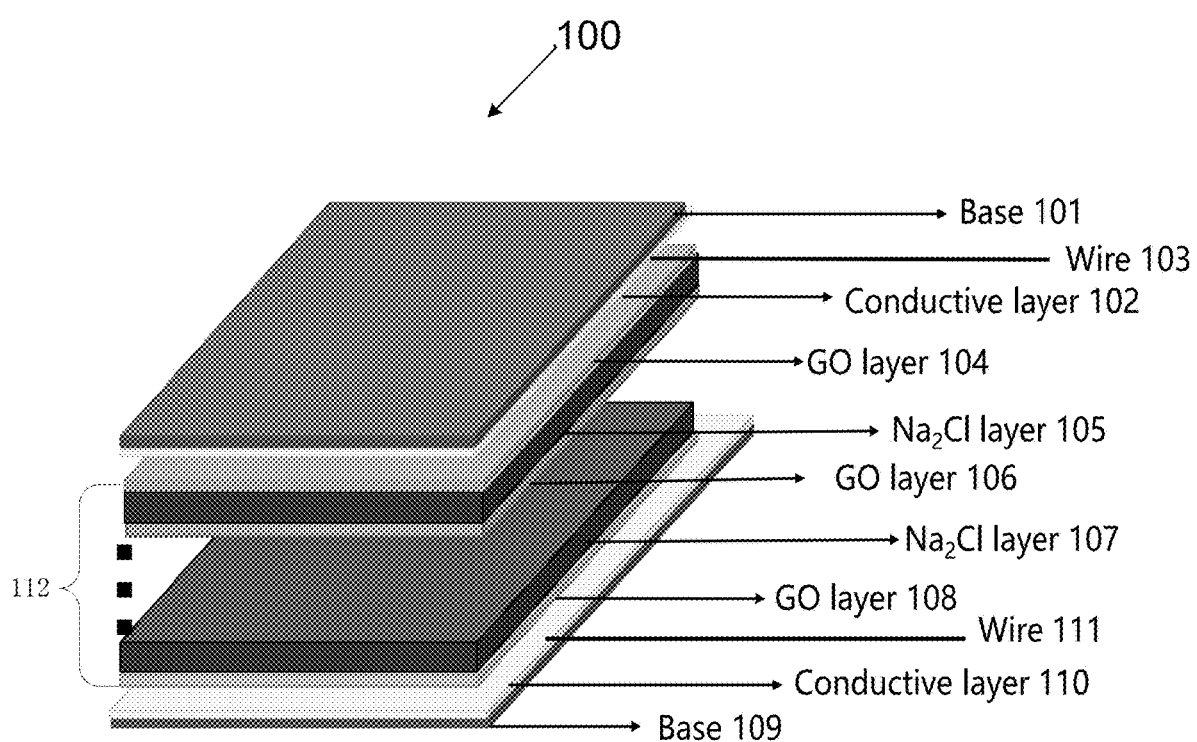
FIGS. 1A and 1B illustrate structure of a piezoelectric sensor, according to some embodiments of the present disclosure.

Some embodiments of the present disclosure will now be described more fully hereinafter with reference to the accompanying figures, in which some, but not all embodiments of the disclosure are shown. Indeed, various embodiments of the disclosure may be embodied in many different forms and should not be construed as limited to the embodiments set forth herein; rather, these example embodiments are provided so that this disclosure will be thorough and complete, and will fully convey the scope of the disclosure to those skilled in the art. For example, unless otherwise indicated, reference something as being a first, second or the like should not be construed to imply a particular order. Like reference numerals refer to like elements throughout.

FIG. 1A illustrates a piezoelectric sensor 100, according to some embodiments of the present disclosure. As shown, the piezoelectric sensor 100 includes a first base 101 and a first conductive layer 102 adjacent to the first base 101. The piezoelectric sensor 100 also includes a second base 109 and a second conductive layer 110 adjacent to the second base 109.

In some embodiments, the first base 101 and the second base 109 include a first insulation film and a second insulation film respectively. In some embodiments, the first insulation film comprises a first Polyimide (PI), Ethylene Vinyl Acetate Copolymer (EVA), Polyvinyl chloride (PVC), Polydimethylsiloxane (PDMS), Polyvinyl Alcohol (PVA), Polypropylene (PP), or Polyethylene glycol terephthalate (PET) film, and the second insulation film comprises a second polyimide (PI), Ethylene Vinyl Acetate Copolymer (EVA), Polyvinyl chloride (PVC), Polydimethylsiloxane (PDMS), Polyvinyl Alcohol (PVA), Polypropylene (PP), or Polyethylene glycol terephthalate (PET) film.

In some embodiments, the first conductive layer 102 and the second conductive layer 110 include a first electrode and a second electrode respectively. In some embodiments, the first electrode comprises a first gold (Au), silver (Ag), platinum (Pt), titanium (Ti), chromium (Cr), copper (Cu), nickel (Ni), aluminum (Al), graphene, or MXene electrode, and the second electrode comprises a second gold (Au), silver (Ag), platinum (Pt), titanium (Ti), chromium (Cr), copper (Cu), nickel (Ni), aluminum (Al), graphene, or MXene electrode. The first electrode may be a positive electrode and the second electrode may be a negative electrode.

In some embodiments, a first wire 103 is connected to the first electrode and extracted from the first conductive layer 102. And a second wire 111 is connected to the second electrode and extracted from the second conductive layer 110.

In some embodiments, the piezoelectric sensor 100 includes a first structure 112 between the first conductive layer 102 and the second conductive layer 110. The first structure 112 includes a first layer 104 with a first carbon-based material and a plurality of second structures. In some embodiments, the first layer 104 may be a layer with graphene oxide (GO), so the first layer may be denoted as GO layer 104.

In some embodiments, each of the plurality of second structures may have the same structure including a second layer 106 with a second carbon-based material and a third layer 105 adjacent to the second layer. In some embodiments, the second layer 106 may be a layer with graphene oxide (GO), so the second layer may be denoted as GO layer 106. In some embodiments, the third layer 105 comprises a material of two-dimensional crystals of unconventional stoichiometries such as $Na_2Cl$ crystals, so the third layer 105 may be denoted as $Na_2Cl$ layer 105. The second structure as a whole has piezoelectricity. The piezoelectricity is mainly attributed to the $Na_2Cl$ crystals with periodic atom vacancies, giving rise to relatively larger deformation under small pressure and resulting in stronger electrostatic polarization. In some embodiments, the piezoelectric sensor uses carbon-based material such as graphene oxide and also uses two-dimensional crystals of unconventional stoichiometries such as $K_2Cl$ crystals, $CaCl$ crystals, $MgCl$ crystals, $NaCl_2$ crystals, and so on. These two-dimensional crystals of unconventional stoichiometries are not in regular and known stoichiometries, compared with the corresponding stable crystals at ambient conditions such as NaCl in a 1:1 stoichiometry, KCl in a 1:1 stoichiometry, $CaCl_2$ in a 1:2 stoichiometry, $MgCl_2$ in a 1:2 stoichiometry.

In some embodiments, in the first structure 112, the second structure is repeated many times (e.g., hundreds to thousands of times) and stacked. For example, as shown in FIG. 1A, a second structure includes the GO layer 106 and the $Na_2Cl$ layer 105. And this second structure is repeated many times and stacked as denoted by the ellipsis in FIG. 1A. And the last repeated second structure in the first structure 112 includes the GO layer 108 and the $Na_2Cl$ layer 107 adjacent to the GO layer 108. In some examples, the second structure can be denoted as $Na_2Cl$@GO.

In some embodiments, the first carbon-based material in the layer 104 comprises graphene oxide, reduced graphene oxide, carbon nanotube or fullerene, and the second carbon-based material in the layer 106 or 108 comprises graphene oxide, reduced graphene oxide, carbon nanotube or fullerene.

In some embodiments, the first conductive layer 102 is in direct contact with the first layer with the first carbon-based material, e.g., the GO layer 104, and the second conductive layer 110 is in direct contact with the second layer of one of the plurality of second structures, e.g., the GO layer 108.

In some embodiments, the first structure 112 comprises or forms a membrane.

Figure 1B:
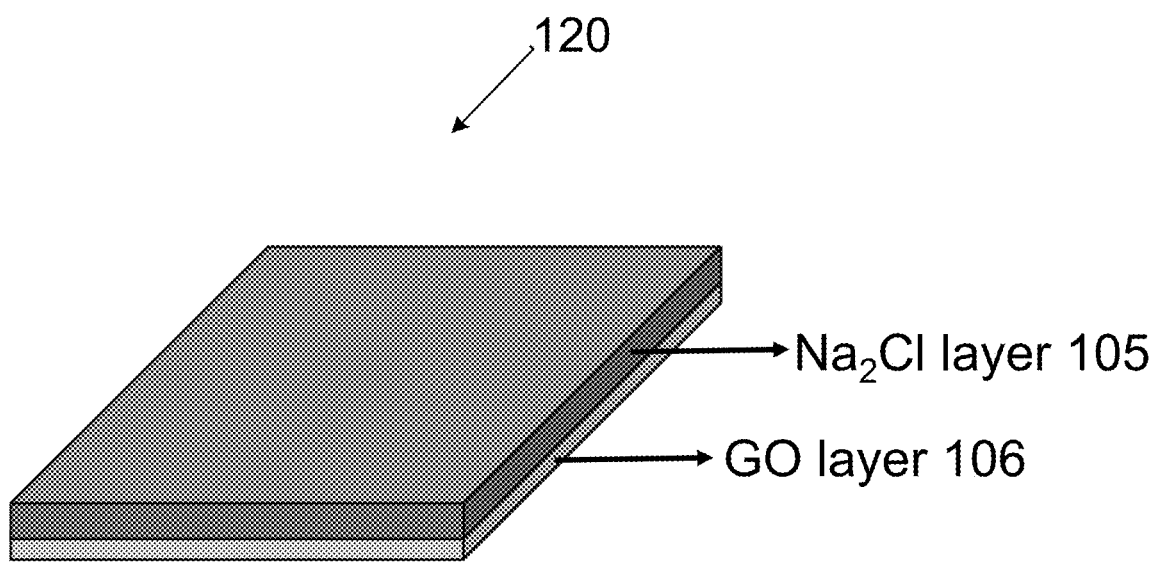

FIG. 1B illustrates a second structure 120, according to some embodiments of the present disclosure. As shown, for example, the second structure 120 may include the GO layer 106 and the $Na_2Cl$ layer 105. The second structure 120 is repeated many times and stacked as described above with respect to FIG. 1A.

In some examples, the fabrication of the piezoelectric sensor 100 can be implemented as follows.

First, graphene oxides (GO) suspension can be prepared. Graphite powders can be put into concentrated $H_2SO_4$, $K_2S_2O_8$, and $P_2O_5$ mixed solution with continuous stirring for 12-24 hours. Then the mixture is diluted with deionized water (DI), centrifuged, and washed with DI water. After drying, the preoxidized graphite sheets are obtained, and further oxidized in concentrated $H_2SO_4$ and $KMnO_4$, diluted with DI water, followed by the addition of 30% $H_2O_2$. These further oxidized graphite sheets are centrifuged and washed with 1:10 HCl aqueous solution and DI water sequentially to remove ion species. Then, few-layer graphene oxides (GO) are separated by centrifugation at 4000 rpm. The concentration of the as-prepared GO suspension is approximately 5 mg/mL. The GO suspension is dialyzed with dialysis bag (e.g., molecular weight cutoff of 14000) for 7 days to remove the absorbed metal ions.

Then, GO membrane is prepared by spraying GO suspension (20 µL, 5 mg/mL) on a polyimide (PI) substrate, followed by drying at 60° C. for 6 hours. The prepared GO membrane is then drop-casting with dilute NaCl solution (0.01 mol/L) and kept in the air for 2 hours. Next, GO suspension is sprayed on the membrane again and dried at 60° C. for another 6 hours, to form the GO membrane within $Na_2Cl$ crystals which are denoted as $Na_2Cl@GO$. The thickness range of $Na_2Cl@GO$ membrane is adjustable, varied from ~100 nm to ~µm based on the spraying times of GO suspension and dilute NaCl solution.

In some examples, with magnetron sputtering method, a Pt electrode with a thickness of 100 nm and a size of 0.5 cm×0.5 cm is prepared on PI base with a thickness of 10 µm. That is, an electrode with PI as the base (e.g., the base 101) and Pt as the conductive channel (e.g., the conductive layer 102) is prepared, i.e., a Pt/PI electrode. The $Na_2Cl@GO$ membrane is sandwiched between two Pt/PI electrodes or between two 100 nm Pt-on-10 µm PI films. And conductive wires 103 and 111 are extracted from the two Pt/PI electrodes. The conductive wires 103 and 111 are welded to the Pt surface through silver paste. Then, the piezoelectric sensor 100 can be edge-packaged using 3M Kapton tape 301.

In some examples, the size of $Na_2Cl@GO$ membrane can be adjustable according to requirements of applications.

Figure 2:
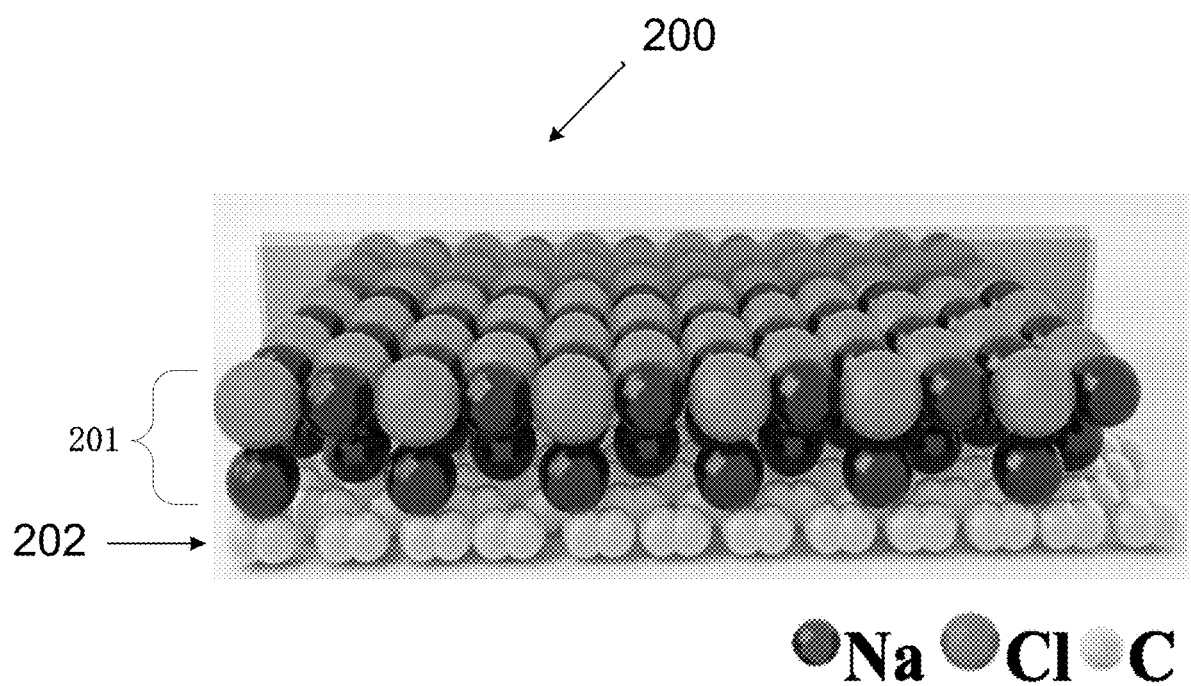
FIG. 2 illustrates a structure of $Na_2Cl$ crystals adsorbed on graphene sheet, denoted as $Na_2Cl$@graphene, according to some embodiments of the present disclosure.

FIG. 2 illustrates a structure 200 of $Na_2 Cl@graphene$, according to some embodiments of the present disclosure. Since the formation of $Na_2Cl$ crystals is attributed to the $Na^+$-π interaction between $Na^+$ cations and π-conjugated benzene rings, in FIG. 2, the structure 200 only shows the graphene belonging to part of graphene oxides without showing oxidizing functional groups. The structure 200 may correspond to the second structure 120 in FIG. 1B. In some examples, the structure 200 includes two parts, which are $Na_2Cl$ layer 201 and carbon-based material or graphene layer 202. The $Na_2Cl$ layer 201 may correspond to the $Na_2Cl$ layer 105, and the carbon-based material or graphene layer 202 may correspond to the GO layer 106 in FIG. 1B.

Figure 3:
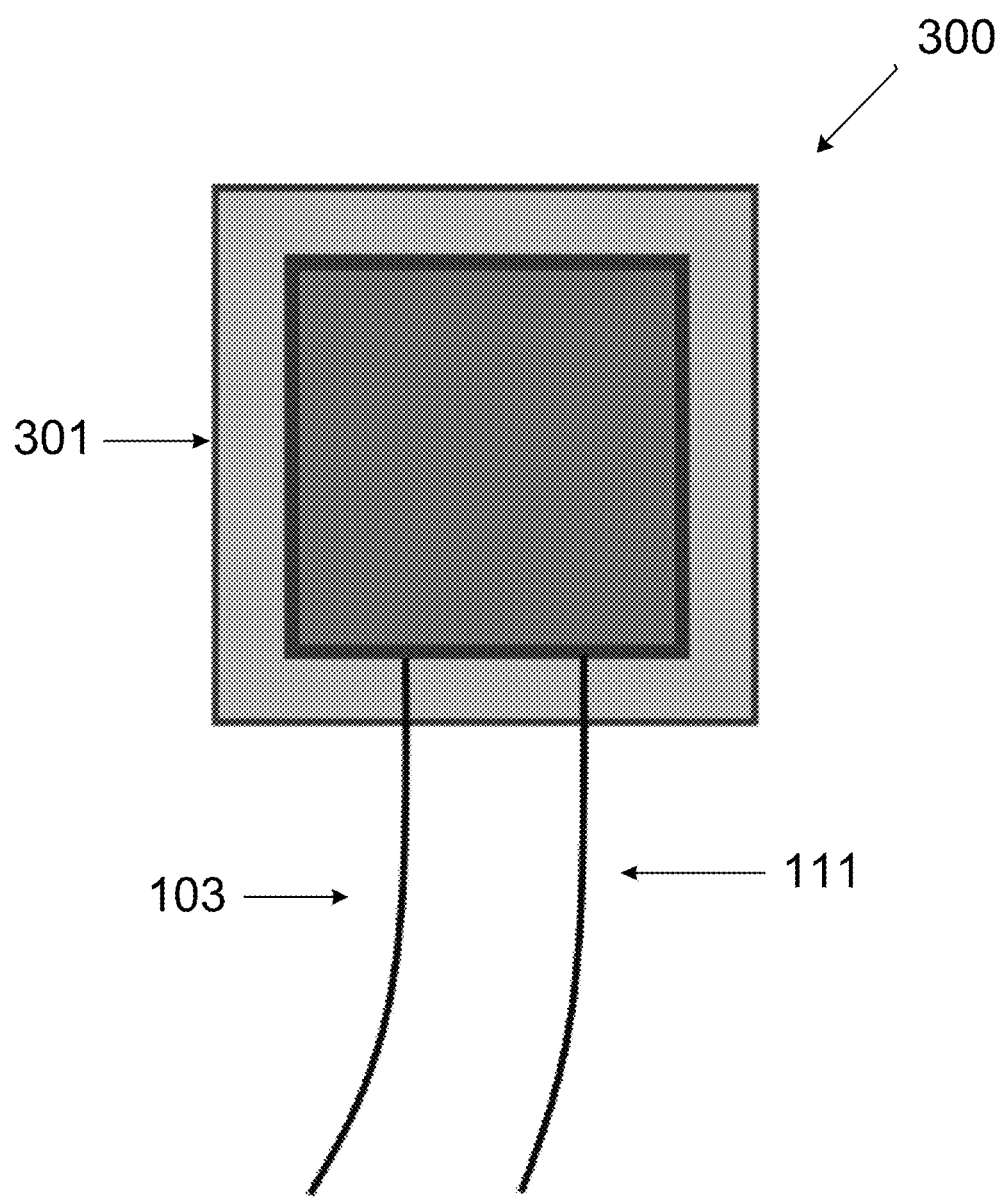
FIG. 3 illustrates a piezoelectric sensor with a tape as an encapsulation of the piezoelectric sensor, according to some embodiments of the present disclosure.

FIG. 3 illustrates a piezoelectric sensor 300 with a tape 301 as an encapsulation of the piezoelectric sensor, according to some embodiments of the present disclosure. The piezoelectric sensor 300 may correspond to the piezoelectric sensor 100 in FIG. 1A. As shown, the piezoelectric sensor 300 includes a tape 301 as an encapsulation to protect the piezoelectric sensor 300. The piezoelectric sensor 300 also includes the wires 103 and 111, used to measure changes in electrical signals to judge changes in pressure signals. For example, the wires 103 and 111 may be connected to an oscilloscope or voltmeter to measure changes.

Figure 4:
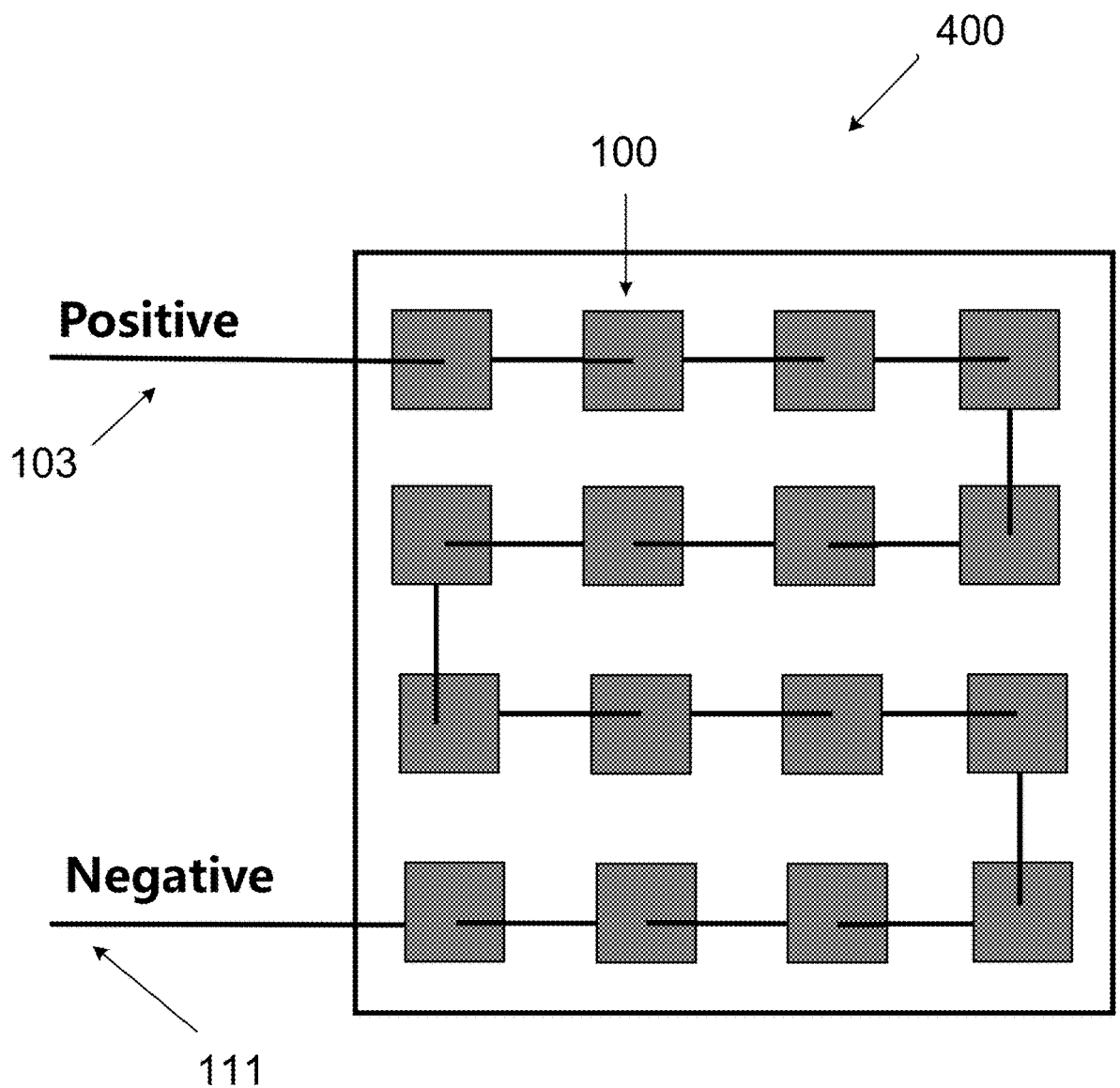
FIG. 4 illustrates a piezoelectric sensor array, according to some embodiments of the present disclosure.

FIG. 4 illustrates a piezoelectric sensor array 400, according to some embodiments of the present disclosure. As shown, the piezoelectric sensor array 400 includes multiple piezoelectric sensors 100 connected via series connection. One piezoelectric sensor 100 in the array 400 may include the wire 103, and another piezoelectric sensor 100 in the array 400 may include the wire 111, used to measure changes in pressure by observing voltage changes. The piezoelectric sensor array 400 can improve the output voltage and thus output power, and can be used for energy harvesting and storage.

Many modifications and other embodiments of the disclosure set forth herein will come to mind to one skilled in the art to which the disclosure pertains having the benefit of the teachings presented in the foregoing description and the associated figures. Therefore, it is to be understood that the disclosure is not to be limited to the specific embodiments disclosed and that modifications and other embodiments are intended to be included within the scope of the appended claims. Moreover, although the foregoing description and the associated figures describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A piezoelectric sensor, comprising:
a first base;
a first conductive layer adjacent to the first base;
a second base;
a second conductive layer adjacent to the second base; and
a first structure between the first conductive layer and the second conductive layer, wherein the first structure comprises:
a first layer with a first carbon-based material;
a plurality of second structures with piezoelectricity, each comprising:
a second layer with a second carbon-based material; and
a third layer adjacent to the second layer, wherein the third layer comprises a material of $Na_2Cl$ crystals.

2. The piezoelectric sensor of claim 1, wherein the first base and the second base comprise a first insulation film and a second insulation film respectively.

3. The piezoelectric sensor of claim 2, wherein the first insulation film comprises a first Polyimide (PI), Ethylene Vinyl Acetate Copolymer (EVA), Polyvinyl chloride (PVC), Polydimethylsiloxane (PDMS), Polyvinyl Alcohol (PVA), Polypropylene (PP), or Polyethylene glycol terephthalate (PET) film, and the second insulation film comprises a second polyimide (PI), Ethylene Vinyl Acetate Copolymer (EVA), Polyvinyl chloride (PVC), Polydimethylsiloxane (PDMS), Polyvinyl Alcohol (PVA), Polypropylene (PP), or Polyethylene glycol terephthalate (PET) film.

4. The piezoelectric sensor of claim 1, wherein the first conductive layer and the second conductive layer comprise a first electrode and a second electrode respectively.

5. The piezoelectric sensor of claim 4, wherein the first electrode comprises a first gold (Au), silver (Ag), platinum (Pt), titanium (Ti), chromium (Cr), copper (Cu), nickel (Ni), aluminum (Al), graphene, or MXene electrode, and the second electrode comprises a second gold (Au), silver (Ag), platinum (Pt), titanium (Ti), chromium (Cr), copper (Cu), nickel (Ni), aluminum (Al), graphene, or MXene electrode.

6. The piezoelectric sensor of claim 4, wherein a first wire is connected to the first electrode and a second wire is connected to the second electrode.

7. The piezoelectric sensor of claim 1, wherein the first conductive layer is in contact with the first layer, and wherein the second conductive layer is in contact with the second layer of one of the plurality of second structures.

8. The piezoelectric sensor of claim 1, wherein the first structure comprises a membrane.

9. The piezoelectric sensor of claim 1, wherein the first carbon-based material comprises graphene oxide, reduced graphene oxide, carbon nanotube or fullerene, and the second carbon-based material comprises graphene oxide, reduced graphene oxide, carbon nanotube or fullerene.

10. The piezoelectric sensor of claim 1, further comprising a tape as an encapsulation of the piezoelectric sensor.

\* \* \* \* \*